(12) United States Patent
Fujisawa et al.

(10) Patent No.: US 11,227,861 B2
(45) Date of Patent: Jan. 18, 2022

(54) INTEGRATED ASSEMBLIES COMPRISING SENSE-AMPLIFIER-CIRCUITRY AND WORDLINE-DRIVER-CIRCUITRY UNDER MEMORY CELLS OF A MEMORY ARRAY

(71) Applicant: Micron Technology, Inc., Boise, ID (US)

(72) Inventors: Hiroki Fujisawa, Kanagawa (JP); Charles L. Ingalls, Meridian, ID (US); Richard J. Hill, Boise, ID (US); Gurtej S. Sandhu, Boise, ID (US); Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/125,651

(22) Filed: Dec. 17, 2020

(65) Prior Publication Data

US 2021/0143142 A1    May 13, 2021

Related U.S. Application Data

(62) Division of application No. 16/553,448, filed on Aug. 28, 2019, now Pat. No. 10,957,681.

(51) Int. Cl.
| | |
|---|---|
| *G11C 11/40* | (2006.01) |
| *H01L 25/18* | (2006.01) |
| *G11C 11/4091* | (2006.01) |
| *H01L 23/528* | (2006.01) |
| *H01L 27/108* | (2006.01) |
| *G11C 11/408* | (2006.01) |
| *H01L 29/78* | (2006.01) |

(52) U.S. Cl.
CPC .......... *H01L 25/18* (2013.01); *G11C 11/4085* (2013.01); *G11C 11/4091* (2013.01); *H01L 23/528* (2013.01); *H01L 27/10817* (2013.01); *H01L 27/10897* (2013.01); *H01L 29/7827* (2013.01)

(58) Field of Classification Search
CPC . G11C 249/743; G11C 11/4085; H01L 25/18; H01L 25/528
See application file for complete search history.

(56) References Cited

U.S. PATENT DOCUMENTS

| 9,589,608 B2 | 3/2017 | Seko |
| 2009/0257278 A1 | 10/2009 | Hahn |

(Continued)

FOREIGN PATENT DOCUMENTS

| JP | 2016-100035 | 5/2016 |
| WO | WO PCT/US2020/031529 | 8/2020 |

*Primary Examiner* — Han Yang
(74) *Attorney, Agent, or Firm* — Wells St. John P.S.

(57) ABSTRACT

Some embodiments include an integrated assembly having a base comprising sense-amplifier-circuitry, a first deck over the base, and a second deck over the first deck. The first deck includes a first portion of a first array of first memory cells, and includes a first portion of a second array of second memory cells. The second deck includes a second portion of the first array of the first memory cells, and includes a second portion of the second array of the second memory cells. A first digit line is associated with the first array, and a second digit line is associated with the second array. The first and second digit lines are comparatively coupled with one another through the sense-amplifier-circuitry.

8 Claims, 10 Drawing Sheets

(56) References Cited

U.S. PATENT DOCUMENTS

| | | |
|---|---|---|
| 2010/0008126 A1 | 1/2010 | Toda |
| 2011/0205789 A1 | 8/2011 | Kim |
| 2012/0320654 A1 | 12/2012 | Yoko |
| 2018/0122825 A1 | 5/2018 | Lupino et al. |
| 2018/0218765 A1 | 8/2018 | Derner et al. |
| 2019/0139594 A1 | 5/2019 | Ryu et al. |
| 2020/0051614 A1 | 2/2020 | Derner et al. |
| 2020/0176420 A1 | 6/2020 | Or-Bach et al. |
| 2020/0227397 A1* | 7/2020 | Yada ................ H01L 25/50 |

* cited by examiner

INTEGRATED ASSEMBLIES COMPRISING SENSE-AMPLIFIER-CIRCUITRY AND WORDLINE-DRIVER-CIRCUITRY UNDER MEMORY CELLS OF A MEMORY ARRAY

RELATED PATENT DATA

This patent resulted from a divisional of U.S. patent application Ser. No. 16/553,448 filed Aug. 28, 2019, which is hereby incorporated herein by reference.

TECHNICAL FIELD

Memory arrays (e.g., DRAM arrays). Integrated assemblies comprising vertically-stacked decks. Integrated assemblies having sense-amplifier-circuitry and wordline-driver-circuitry under memory cells of a memory array.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("ARRAY-1" and "ARRAY-2"), with each of the arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (ARRAY-1), and digit lines D0*-D8* are associated with the second array (ARRAY-2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

A continuing goal of integrated circuit fabrication is to increase packing density and to thereby increase the level of integration. It would be desirable to develop three-dimensional arrangements having tightly packed memory.

DETAILED DESCRIPTION OF THE ILLUSTRATED EMBODIMENTS

Some embodiments include integrated assemblies in which first and second memory arrays are laterally adjacent to one another and extend along multiple decks of a multi-deck-assembly, and in which sense-amplifier-circuitry and wordline-driver-circuitry is provided under the first and second memory arrays. The sense-amplifier-circuitry may be broken amongst multiple blocks (subunits) under the first and second memory arrays, and similarly the wordline-driver-circuitry may be broken amongst multiple blocks (subunits) under the first and second memory arrays. The blocks (subunits) of the sense-amplifier-circuitry and the wordline-driver-circuitry may be considered to form a quilt pattern under the first and second memory arrays. Example embodiments are described with reference to FIGS. 4, 5, 6A, 6B, 7A, 7B, 8A, 8B and 9.

Figure 4:
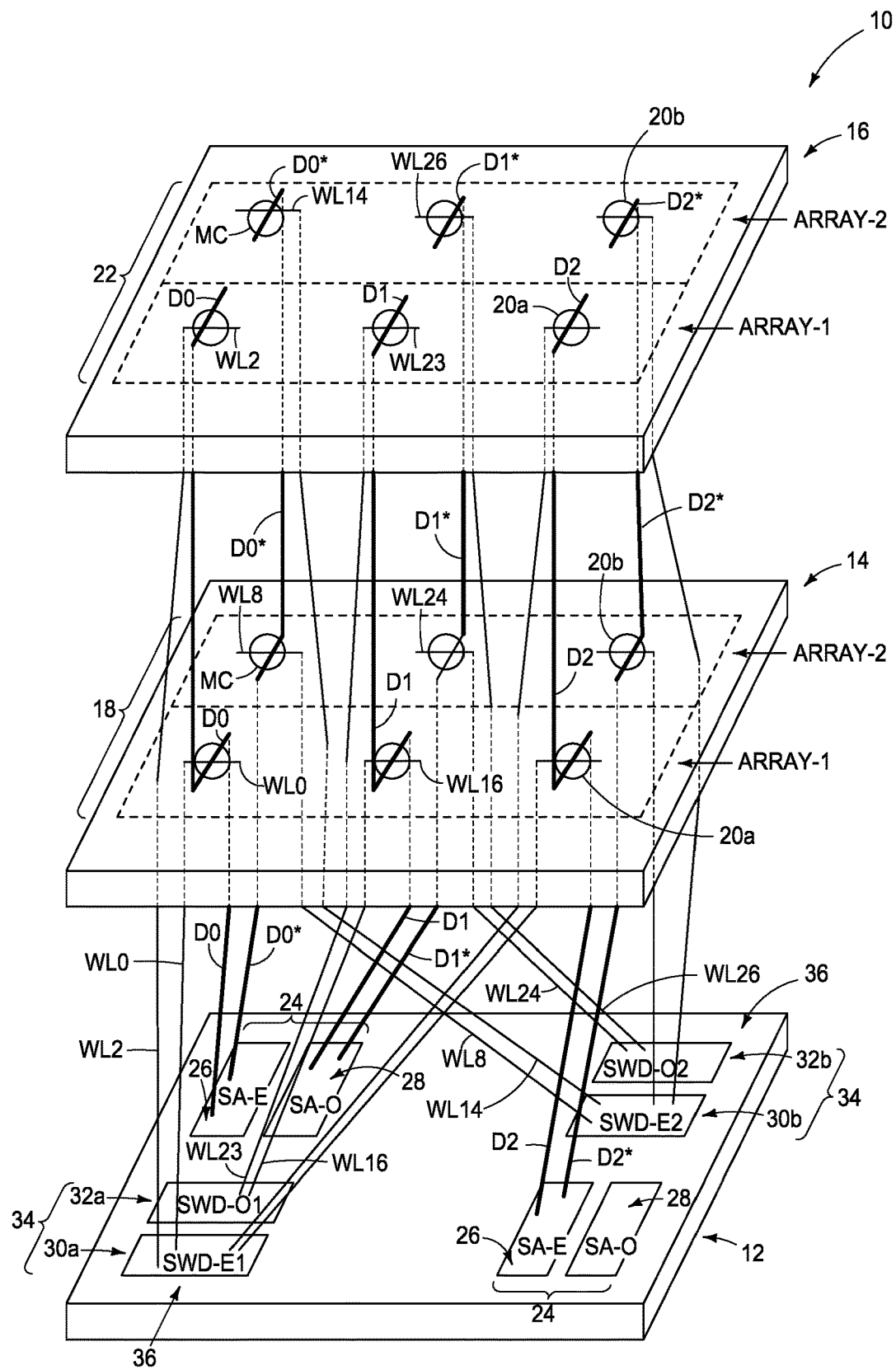
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck. The structures 12, 14 and 16 are vertically stacked one atop another. The base 12, first deck 14 and second deck 16 may be considered to be examples of levels that are stacked one atop the other. The levels may be within different semiconductor dies, or at least two of the levels may be within the same semiconductor die.

Figure 1:
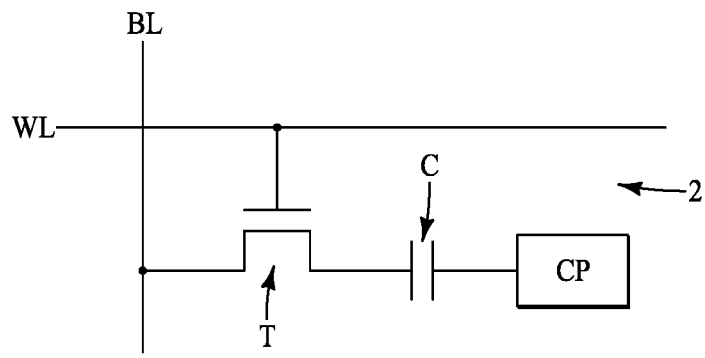
FIG. 1 is a schematic diagram of a prior art memory cell having 1 transistor and 1 capacitor.
Figure 2:
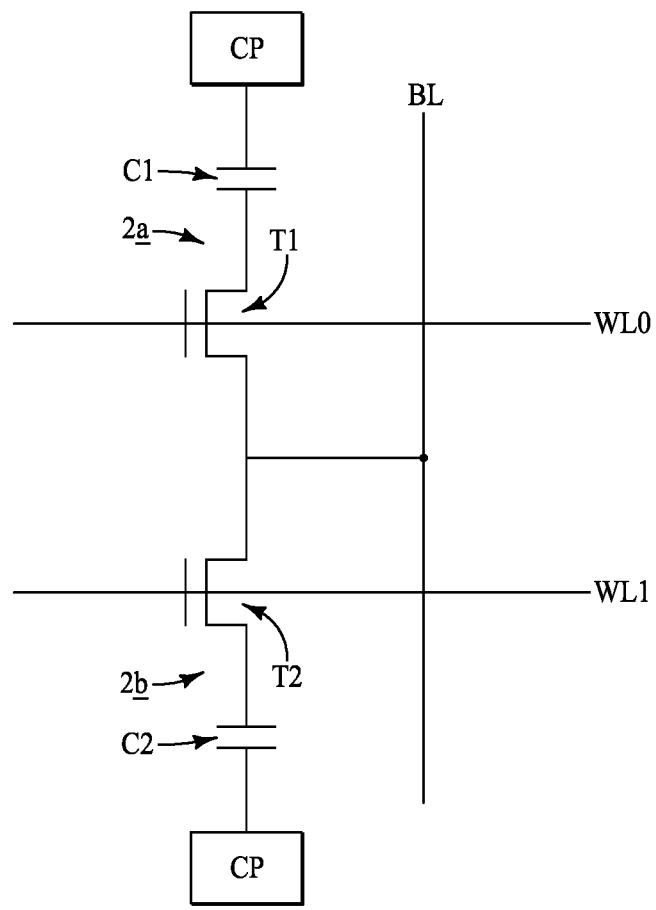
FIG. 2 is a schematic diagram of a pair of prior art memory cells which each have 1 transistor and 1 capacitor, and which share a bitline connection.
Figure 3:
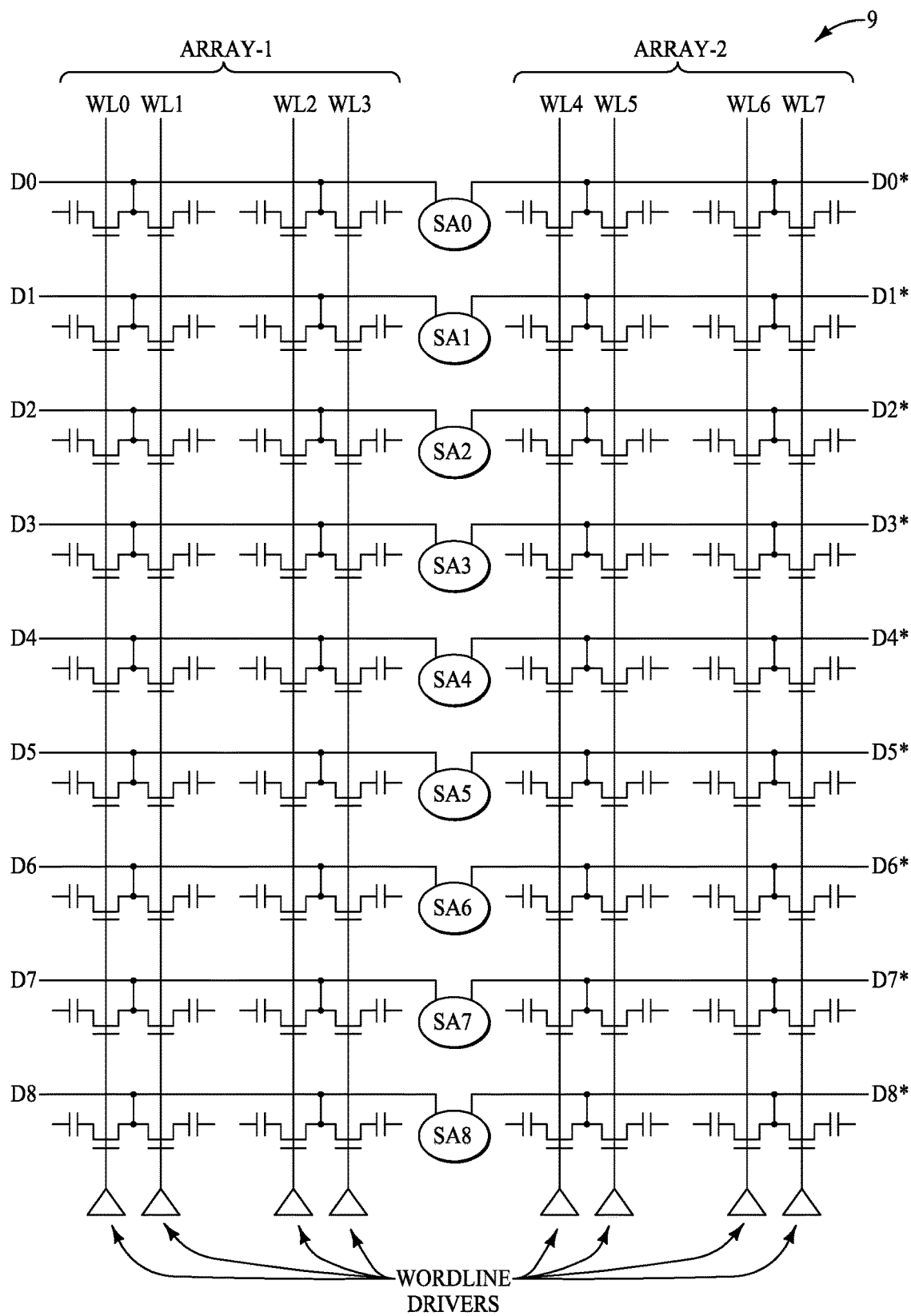
FIG. 3 is a schematic diagram of a prior art integrated assembly having open bitline architecture.

The first and second decks 14 and 16 have memory regions 18 and 22, respectively. First and second memory arrays (ARRAY-1 and ARRAY-2) are supported by the first and second decks 14 and 16, with each of the memory arrays having a first portion along the first (lower) deck 14 and a second portion along the second (upper) deck 16. The first memory array includes first memory cells (MC) 20a, and the second memory array includes second memory cells (MC) 20b. The memory cells are diagrammatically illustrated as circles. Only some of the first and second memory cells are labeled. The first and second memory arrays may comprise any suitable number of memory cells, and in some embodiments may comprise hundreds, thousands, millions, etc., of memory cells. The memory cells MC may be DRAM cells, and in some embodiments may be configured in arrangements of the types described above with reference to prior art FIGS. 1-3 (i.e., ARRAY-1 and ARRAY-2 may be DRAM arrays).

In some embodiments, the first and second decks 14 and 16 may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises sense-amplifier-circuitry (SA), and wordline-driver-circuitry (WD).

The sense-amplifier-circuitry includes regions labeled "SA-E" to identify them as being associated with an "even" portion of a circuit, and regions labeled "SA-O" to identify them as being associated with an "odd" portion of a circuit. The terms "even" and "odd" are arbitrary, and are utilized to distinguish the different sense-amplifier-circuitries from one another. The illustrated configuration has the sense-amplifier-circuitries SA-O and SA-E paired with one another and distributed as structures 24. The structures 24 are spread across the base 16, with the two illustrated structures 24 being spaced-apart from one another. In the shown embodiment, the two illustrated structures 24 are laterally disposed (horizontally offset) relative to one another. The distribution of the sense-amplifier-circuitries SA-O and SA-E within the structures 24 can enable the sense-amplifier-circuitries to be located directly under the memory cells MC of ARRAY-1 and ARRAY-2, and can leave room under the arrays for the wordline-driver-circuitry. Although the sense-amplifier-circuitries SA-O and SA-E are shown distributed amongst two structures 24, in the other embodiments the sense-amplifier-circuitries SA-O and SA-E may be distributed amongst a different number of the structures 24 than the illustrated two structures (e.g., three or more of the structures 24).

In some embodiments, one of the sense-amplifier-circuitries SA-O and SA-E may be referred to as a first sense-amplifier-circuitry and the other may be referred to as a second sense-amplifier-circuitry. The first and second sense-amplifier-circuitries are laterally displaced relative to one another, and are together incorporated into the structures 24. In some embodiments, the structures 24 may be considered to be paired-block arrangements which comprise first blocks 26 corresponding to the SA-E circuitry, and which comprise second blocks 28 corresponding to the SA-O circuitry.

The wordline-driver-circuitry (i.e., row-driver circuitry) includes regions labeled SWD-E1, SWD-E2, SWD-O1 and SWD-O2. The acronym SWD stands for sub-wordline-driver, and is utilized to emphasize that the components SWD-E1, SWD-E2, SWD-O1 and SWD-O2 are portions of the general wordline-driver-circuitry. The wordline-driver-circuitries SWD-E1 and SWD-E2 are together utilized during operation of the memory cells (MC) associated with the "even" circuits coupled with SA-E; and the wordline-driver-circuitries SWD-O1 and SWD-O2 are together utilized during operation of the memory cells (MC) associated with the "odd" circuits coupled with SA-O. In some embodiments, the wordline-driver-circuitries SWD-E1 and SWD-E2 may be considered to be comprised by a first wordline-driver-circuitry (the circuitry utilized to drive the "even" circuits), and the wordline-driver-circuitries SWD-O1 and SWD-O2 may be considered to be comprised by a second wordline-driver-circuitry (the circuitry utilized to drive the "odd" circuits).

In some embodiments, the wordline-driver-circuitries SWD-E1 and SWD-E2 may be considered to correspond to third blocks 30 (with SWD-E1 being labeled 30a and SWD-E2 being labeled 30b so that they may be distinguished relative to one another); and the wordline-driver-circuitries SWD-O1 and SWD-O2 may be considered to correspond to fourth blocks 32 (with the SWD-O1 being labeled 32a and SWD-O2 being labeled 32b so that they may be distinguished relative to one another). The third and fourth blocks 30 and 32 are laterally displaced relative to one another, and are together incorporated into paired-block arrangements 34. In the shown embodiment, one of the paired-block arrangements 34 comprises SWD-E1 and SWD-O1, and the other comprises SWD-E2 and SWD-O2. In other embodiments, the paired-block-arrangements 34 may have other combinations of the SWD circuitries.

The paired-block arrangements 24 and 34 may be referred to as first and second paired-block arrangements, respectively, so that they may be distinguished from one another. In some embodiments, the paired-block arrangements 24 and 34 may be together considered to be incorporated into a quilted pattern 36 which is directly under the memory cells MC of the first and second memory arrays (ARRAY-1 and ARRAY-2). The term "quilted pattern" is utilized to indicate that the paired-block arrangements 24 and 34 are distributed in a substantially repeating pattern of subunits; with such subunits being analogous to the "blocks" of fabric which are incorporated into some types of quilts.

First digit lines D0, D1 and D2 are associated with the first memory array (ARRAY-1). The first digit lines D0, D1 and D2 extend along the first memory array (ARRAY-1) and are coupled with first memory cells 20a of the first memory array. The digit lines D0, D1 and D2 are laterally spaced from one another, and may be representative of a large number of substantially identical digit lines extending across the first memory array; with the term "substantially identical" meaning identical to within reasonable tolerances of fabrication and measurement. The first digit lines alternate between even first digit lines and odd first digit lines, with the digit lines D0 and D2 being representative of even first digit lines, and the digit line D1 being representative of an odd first digit line. The even first digit lines (e.g., D0) are coupled with the first sense-amplifier-circuitry 26 (i.e., SA-E), and the odd first digit lines (e.g., D1) are coupled with the second sense-amplifier-circuitry 28 (i.e., SA-O). The first digit lines D0, D1 and D2 have first portions along the first deck 14, and have second portions along the second deck 16.

Second digit lines D0*, D1* and D2* are associated with the second memory array (ARRAY-2). The second digit lines D0*. D1* and D2* extend along the second memory array and are coupled with second memory cells 20b of the second memory array (ARRAY-2). The digit lines D0*, D1* and D2* are laterally spaced from one another, and may be representative of a large number of substantially identical digit lines extending across the second memory array. The second digit lines alternate between even second digit lines and odd second digit lines, with the digit lines D0* and D2* being representative of even second digit lines, and the digit line D1* being representative of an odd second digit line. The even second digit lines (e.g., D0*) are coupled with the first sense-amplifier-circuitry SA-E, and the odd second digit lines (e.g., D1*) are coupled with the second sense-amplifier-circuitry SA-O. The second digit lines D0*, D1* and D2* have first portions along the first deck 14, and have second portions along the second deck 16.

Figure 9:
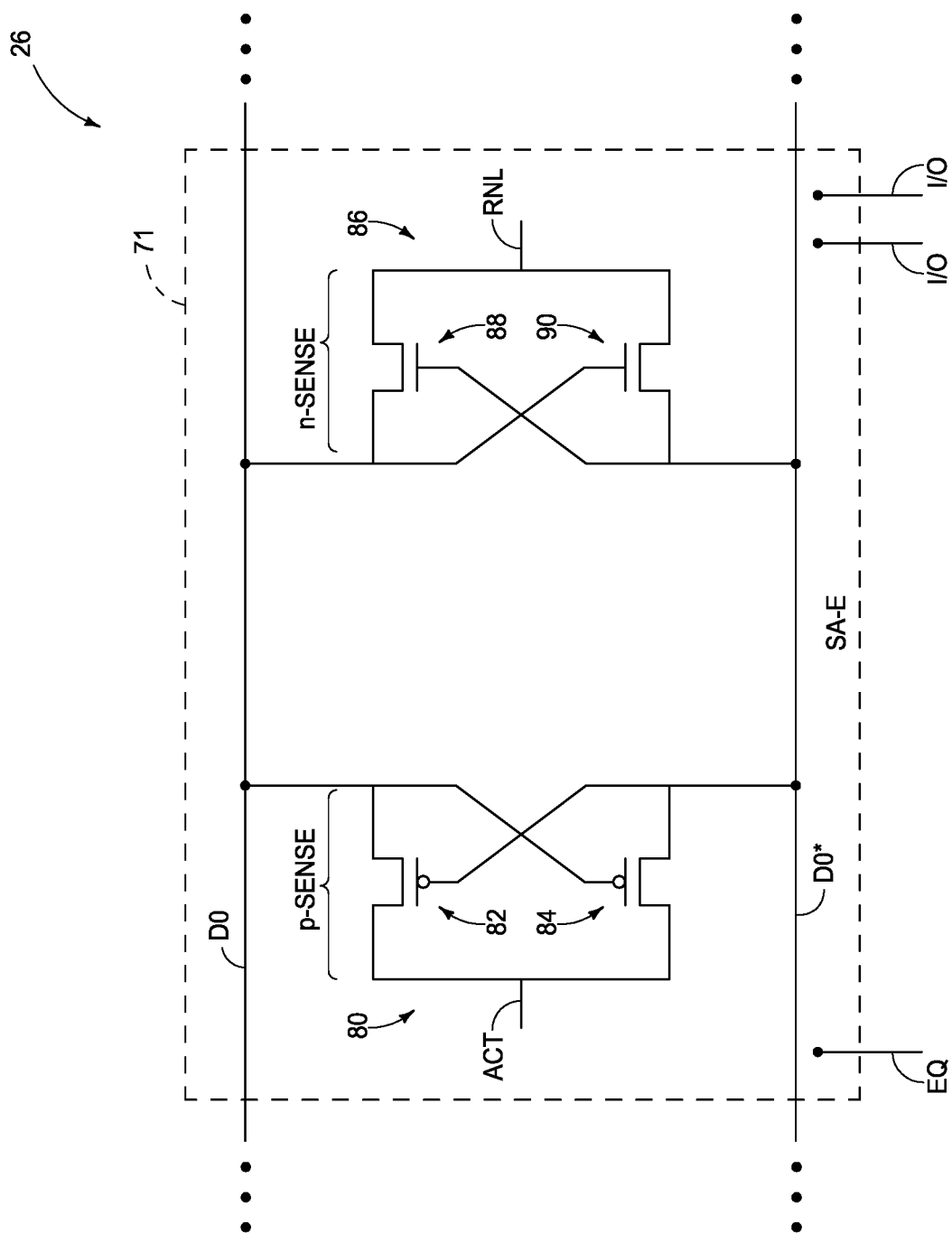
FIG. 9 is a diagrammatic schematic diagram of example sense-amplifier-circuitry.

The even first digit lines D0 and D2 are comparatively coupled with the even second digit lines D0* and D2* through the first sense-amplifier-circuitry SA-E; and the odd first digit line D1 is comparatively coupled with the odd second digit line D1* through the second sense-amplifier-circuitry SA-O. For purposes of understanding this disclosure and the claims that follow, a first digit line is "comparatively coupled" with a second digit line through a sense-amplifier-circuitry if the sense-amplifier-circuitry is configured to compare electrical properties (e.g., voltage) of the first and second digit lines with one another. FIG. 9 (discussed below) shows example first sense-amplifier-circuitry SA-E, and shows an example application in which digit lines D0 and D0* are comparatively coupled through the example first sense-amplifier-circuitry.

In the illustrated embodiment of FIG. 4, the digit lines D0, D0*, D1, D1*, D2 and D2* are all vertically displaced relative to the first and second sense-amplifier-circuitries SA-E and SA-0. Also, the digit lines D0, D0*, D1, D1*, D2 and D2* are all laterally displaced relative to one another.

Referring still to FIG. 4, a first set of wordlines extends along the first memory array (ARRAY-1). Representative wordlines of such first set are labeled as WL0, WL2, WL16 and WL23. The wordlines WL0 and WL2 are coupled with the wordline-driver-circuitry SWD-E1, and the wordlines WL16 and WL23 are coupled with the wordline-driver-circuitry SWD-O1. A second set of wordlines extends along the second memory array (ARRAY-2). Representative wordlines of such second set are labeled as WL8, WL14, WL24 and WL26. The wordlines WL8 and WL14 are coupled with the wordline-driver-circuitry SWD-E2, and the wordlines WL24 and WL26 are coupled with the wordline-driver-circuitry SWD-O2.

In some embodiments, the wordline-driver-circuitries SWD-E1 and SWD-O1 may be considered to be comprised by a first wordline-driver-circuitry which encompasses the wordline-driver-circuitry associated with the first memory array (ARRAY-1), and the wordline-driver-circuitries SWD-E2 and SWD-O2 may be considered to be comprised by a second wordline-driver-circuitry which encompasses the wordline-driver-circuitry associated with the second memory array (ARRAY-2).

Each of the first memory cells 20a within the first memory array (ARRAY-1) is uniquely addressed by one of the digit lines extending along the first memory array (e.g., one of the digit lines D0, D1 and D2), and one of the wordlines extending along the first memory array (e.g., one of the wordlines WL0, WL2, WL16 and WL23). Similarly, each of the memory cells 20b within the second memory array (ARRAY-2) is uniquely addressed by one of the digit lines extending along the second memory array (e.g., one of the digit lines D0*, D1* and D2*), and one of the wordlines extending along the second memory array (e.g., one of the wordlines WL8, WL14, WL24 and WL26). In some embodiments, the digit lines along the first memory array (ARRAY-1) may be referred to as a first set of digit lines, while the digit lines along the second memory (ARRAY-2) are referred to as a second set of digit lines; and similarly the wordlines along the first memory array (ARRAY-1) may be referred to as a first set of wordlines, while the wordlines along the second memory (ARRAY-2) are referred to as a second set of wordlines. Accordingly, each of the memory cells 20a of ARRAY-1 may be considered to be uniquely addressed utilizing a wordline from the first set of wordlines in combination with a digit line from the first set of digit lines; and each of the memory cells 20b of the ARRAY-2 may be considered to be uniquely addressed utilizing a wordline from the second set of wordlines in combination with a digit line from the second set of digit lines.

An advantage of the configuration of FIG. 4 is that all of the sense-amplifier-circuitry and all of the wordline-driver-circuitry is provided directly under the memory arrays (ARRAY-1 and ARRAY-2), which may enable tight packing of the memory arrays across a semiconductor substrate; or in other words, which may conserve valuable semiconductor real estate as compared to conventional configurations in which at least some of the sense-amplifier-circuitry and/or at least some of the wordline-driver-circuitry is not directly under a memory array. The vertical stacking of regions of the memory arrays (ARRAY-1 and ARRAY-2) may further conserve valuable semiconductor real estate.

Figure 5:
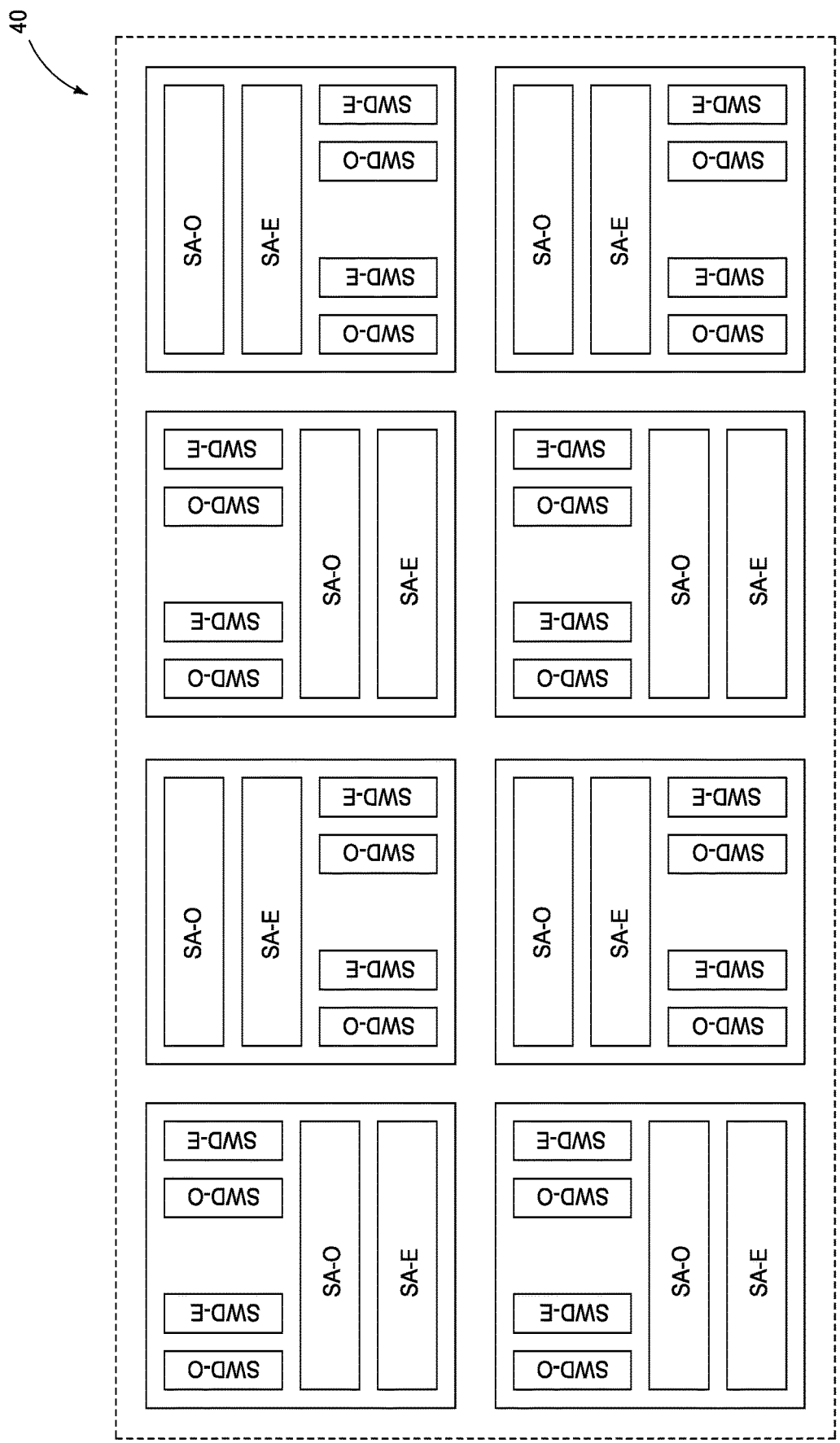
FIG. 5 is diagrammatic top-down view of a layout of an example arrangement of sense-amplifier-circuitry and wordline-driver-circuitry.

The configuration of FIG. 4 may be representative of multiple configurations which are laterally displaced relative to one another across a semiconductor die. For instance, FIG. 5 shows a top-down view of a region of an example die 40 which has multiple memory arrays (not shown) provided thereover. The die 40 of FIG. 5 may correspond to a base die of a vertical stack of dies, and in some embodiments may correspond to the base 12 described above with reference to FIG. 4. The base die 40 shows an example arrangement of sense-amplifier-circuitries (SA-E and SA-O) and wordline-driver-circuitries (SWD-O and SWD-E), and in some embodiments may be considered to illustrate an example quilted arrangement of such circuitries.

Example configurations of regions of the first and second memory arrays (ARRAY-1 and ARRAY-2) are described with reference to FIGS. 6A, 6B, 7A, 7B, 8A and 8B. The decks 12, 14 and 16 are diagrammatically indicated in FIGS. 6A, 6B, 7A, 7B, 8A and 8B to assist the reader in understanding exemplary vertical stacking of the various circuitries and structures shown in the figures.

Figures 6A, 6B:
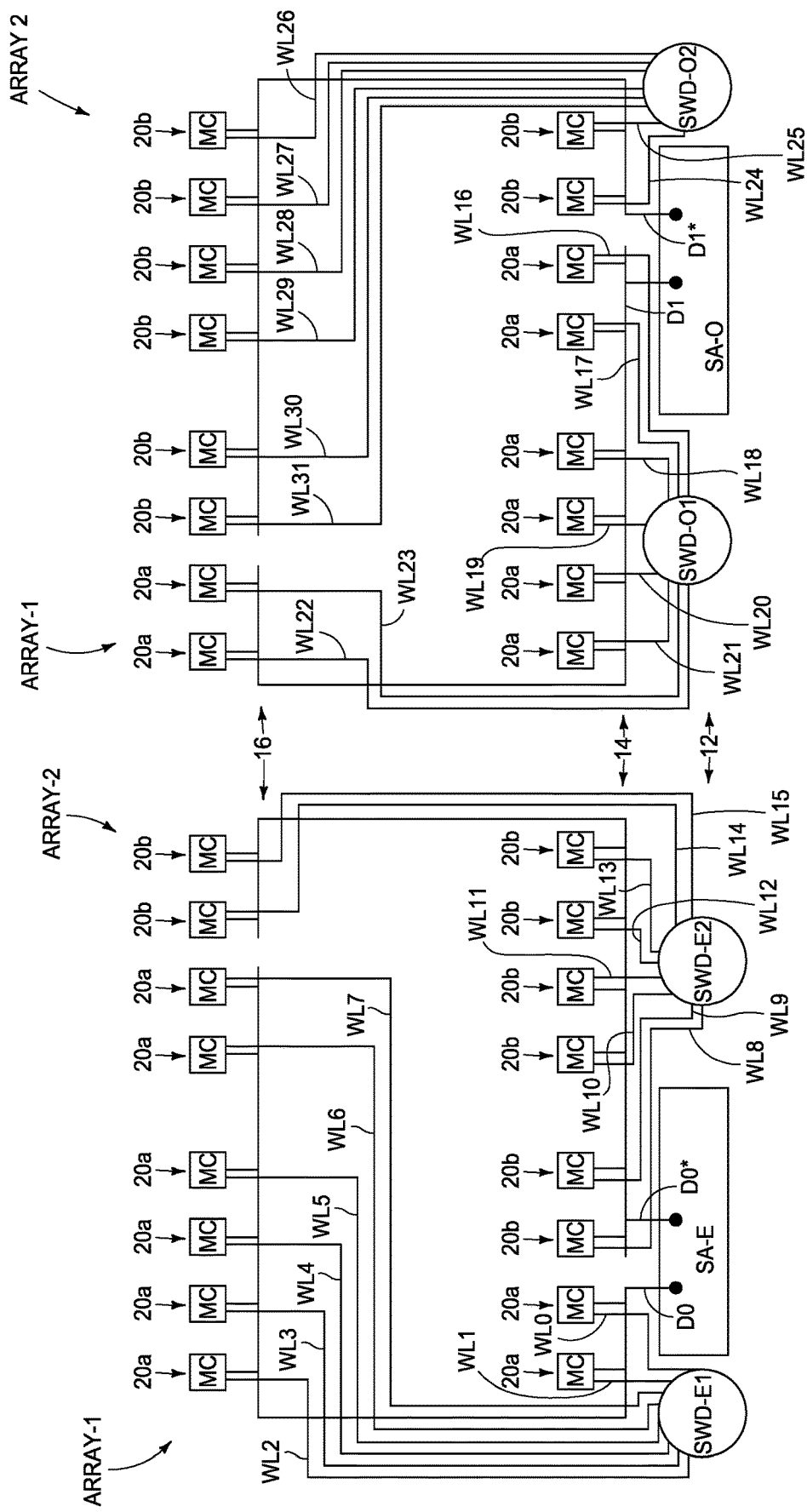
FIGS. 6A and 6B are diagrammatic side views of an example multi-deck-assembly showing example arrangements of circuit components.

Referring to FIGS. 6A and 6B, the memory cells MC are shown along elevational levels corresponding to the decks 14 and 16. Each of the memory cells 20a of ARRAY-1 is uniquely addressed by a digit line (D0 or D1) and a wordline (WL0-WL7 and WL16-23). Each of the memory cells 20b of ARRAY-2 is uniquely addressed by a digit line (D0* or D1*) and a wordline (WL8-WL15 and WL24-31). The digit lines D0 and D0* are comparatively coupled to one another through the sense-amplifier-circuitry SA-E, and the digit lines D1 and D1* are comparatively coupled to one another through the sense-amplifier-circuitry SA-O. Notably, the digit lines DL0 and DL0* are substantially electrically balanced relative to one another by providing regions of each digit line to be along both the upper and lower decks 14 and 16, and similarly the digit lines DL1 and DL1* are substantially electrically balanced relative to one another.

In some embodiments, the wordlines WL0-WL7 and WL16-WL23 may be considered to be the first set of wordlines associated with the first memory array (ARRAY-1); with the wordlines WL0-WL7 being considered to be even wordlines coupled with the wordline-driver-circuitry SWD-E1, and the wordlines WL16-WL23 being considered to be odd wordlines coupled with the wordline-driver-circuitry SWD-O1. Similarly, the wordlines WL8-WL15 and WL24-WL31 may be considered the second set of wordlines associated with the second memory array (ARRAY-2); with the wordlines WL8-WL15 being considered to be even wordlines coupled with the wordline-driver-circuitry SWD-E2, and the wordlines WL24-WL31 being considered to be odd wordlines coupled with the wordline-driver-circuitry SWD-O2.

Figure 7A:
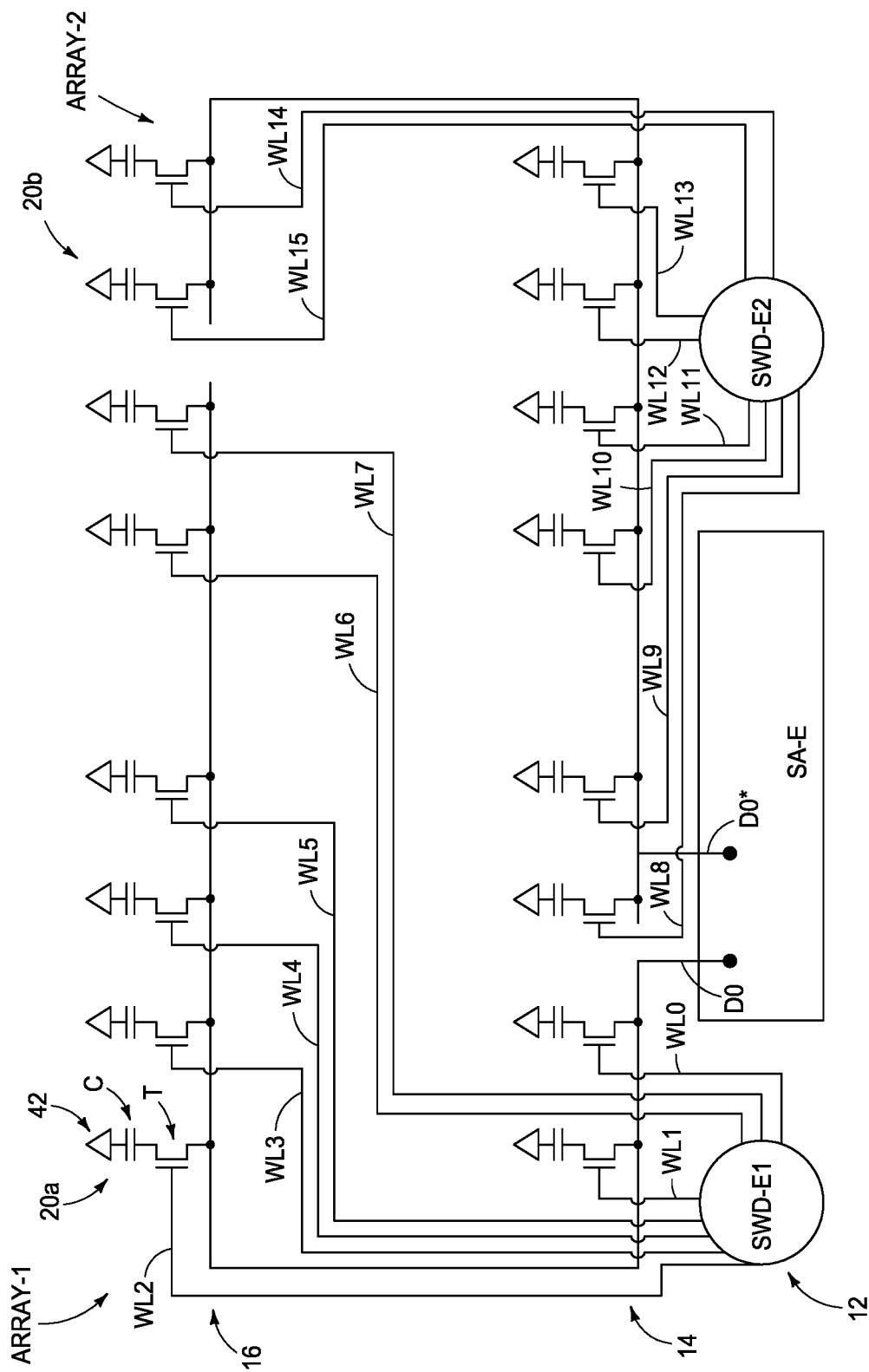
FIGS. 7A and 7B are diagrammatic side views of an example multi-deck-assembly showing example arrangements of circuit components.
Figure 7B:
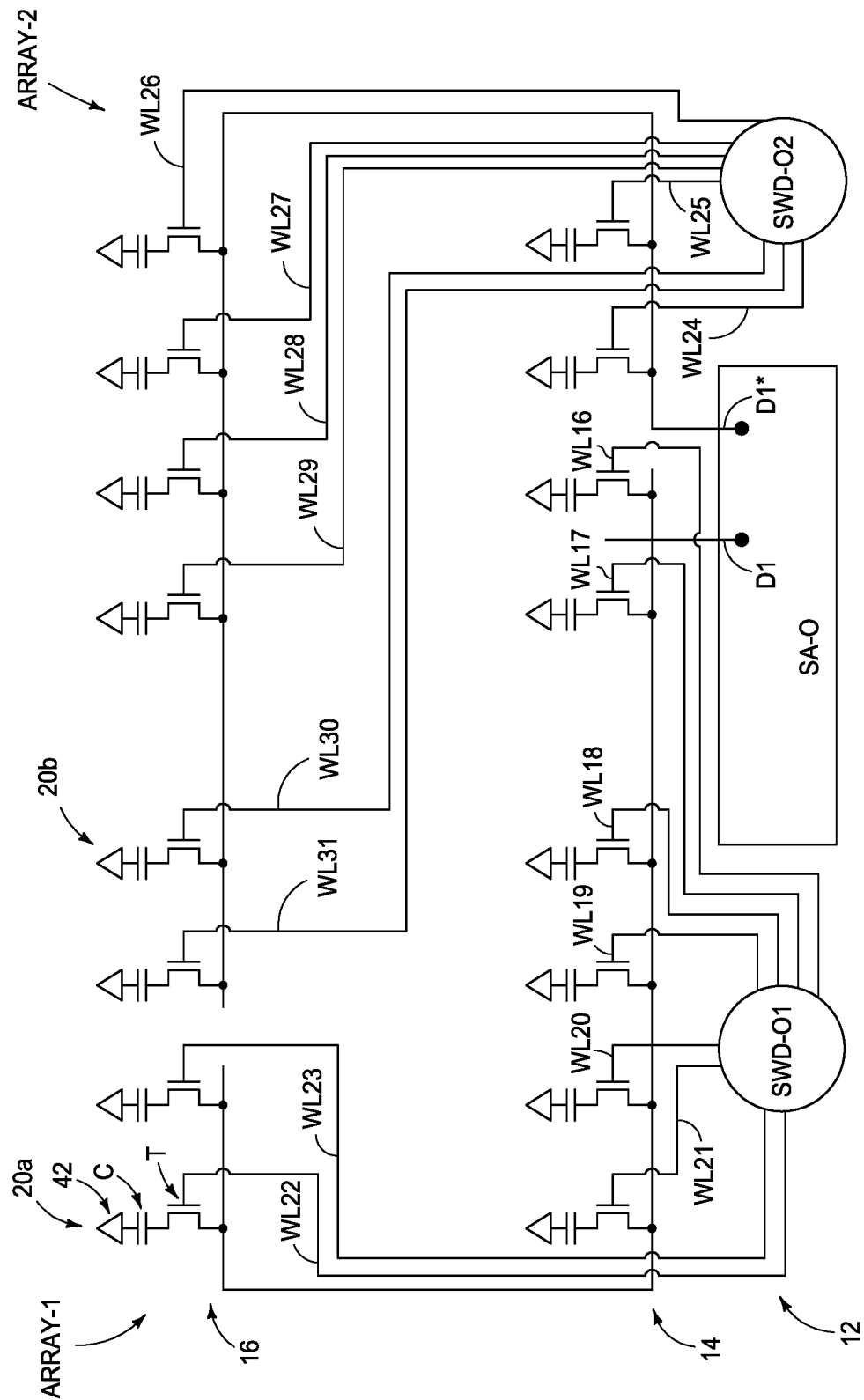

Referring to FIGS. 7A and 7B, the example memory cells 20a and 20b of the first and second memory arrays (ARRAY-1 and ARRAY-2) are shown in more detail than in FIGS. 6A and 6B (only some of the memory cells 20a and 20b are labeled in FIGS. 7A and 7B). Each of the memory cells 20a and 20b includes a transistor T coupled with a capacitor C. Each capacitor has a node coupled with a reference voltage 42. The reference voltage 42 may correspond to the common plate (CP) voltage described above with reference to FIG. 1.

The illustrated memory cells 20a and 20b of FIGS. 7A and 7B are 1T-1C memory cells. In other embodiments, other memory cells may be utilized. The capacitors of the illustrated memory cells 20a and 20b are example storage elements (charge-storage devices), and in other embodiments other suitable storage elements (e.g., phase-change devices, conductive-bridging devices, etc.) may be utilized.

Figure 8A:
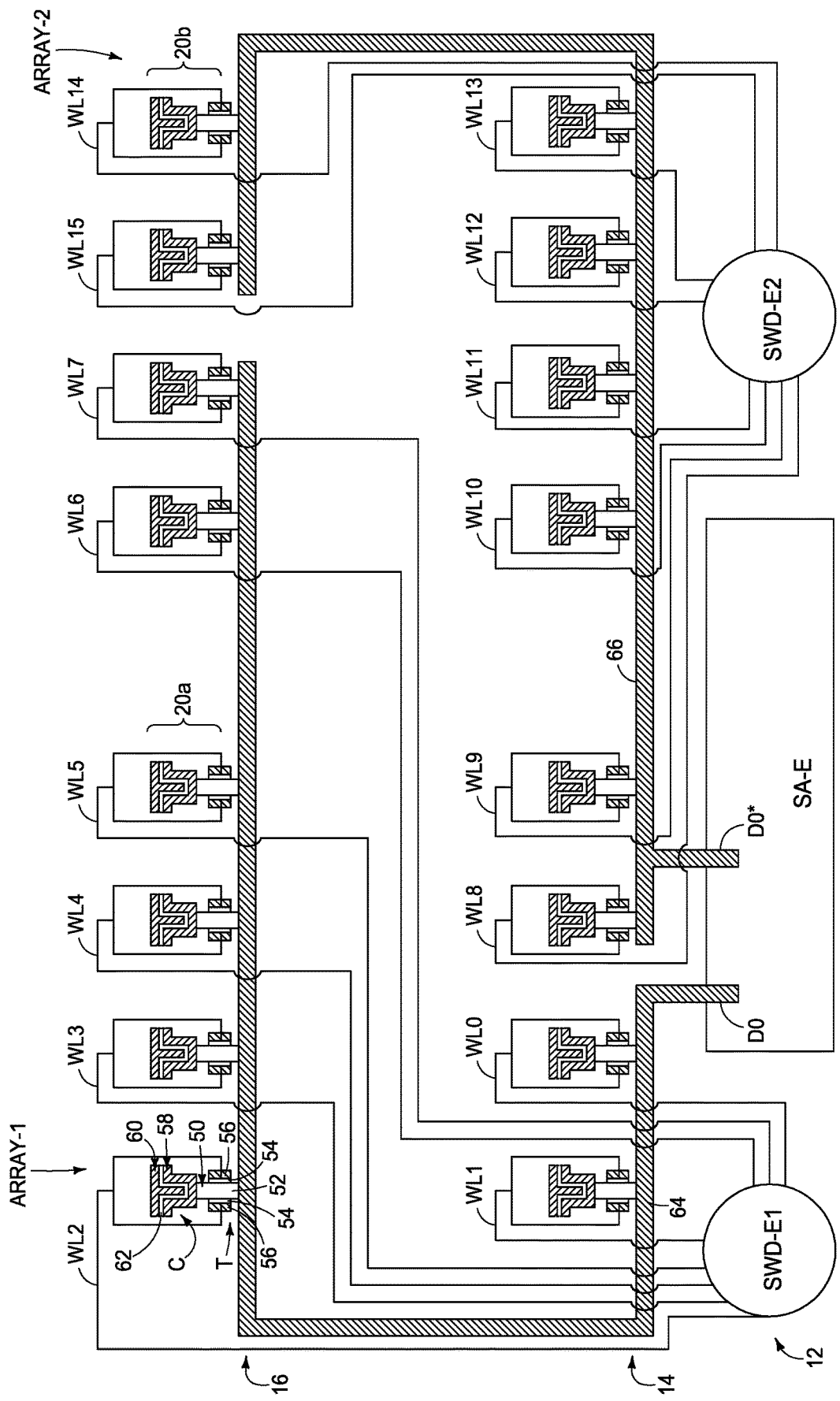
FIGS. 8A and 8B are diagrammatic side views of an example multi-deck-assembly showing example arrangements of circuit components.
Figure 8B:
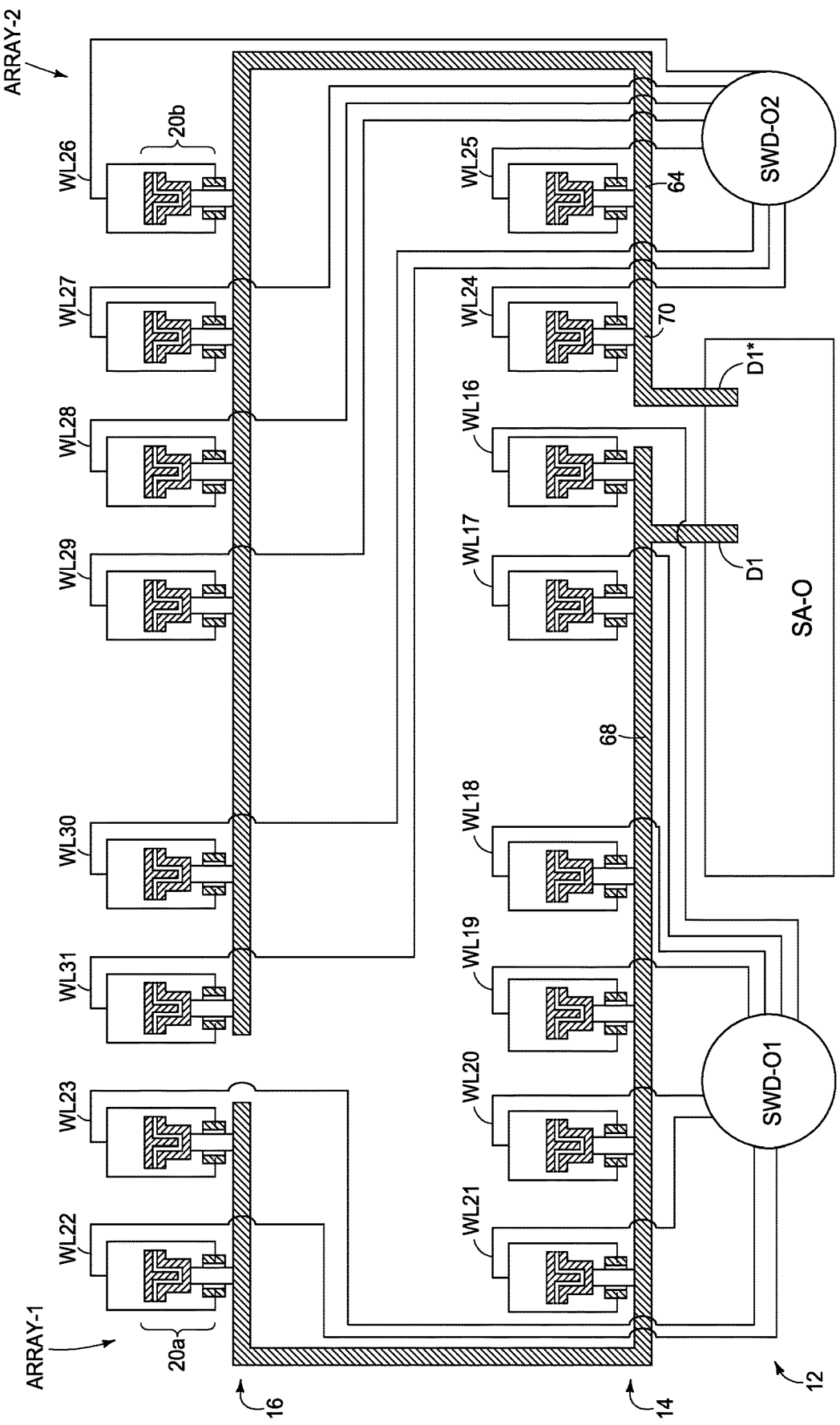

Referring to FIGS. 8A and 8B, the example memory cells 20a and 20b of the first and memory arrays (ARRAY-1 and ARRAY-2) are shown in more detail than in FIGS. 7A and 7B (only some of the memory cells 20a and 20b are labeled in FIGS. 8A and 8B). The transistors T are shown to comprise vertically-extending pillars 50 of semiconductor material 52. The semiconductor material 52 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). Source/drain and channel regions (not shown) may be provided within the pillars 50.

Gate dielectric material 54 is along sidewalls of the pillars 50, and conductive gate material 56 is along the gate dielectric material.

The gate dielectric material 54 may comprise any suitable composition(s); and in some embodiments may comprise, consist essentially of, or consist of silicon dioxide.

The conductive gate material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The capacitors C comprise first conductive nodes 58, second conductive nodes 60, and insulative material (capacitor dielectric material) 62 between the first and second conductive nodes.

The first and second conductive nodes 58 and 60 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another.

The insulative material 62 may comprise any suitable composition(s), and in some embodiments may comprise, consist essentially of, or consist of silicon dioxide.

In the shown embodiment, the lower conductive nodes 58 are configured as upwardly-opening containers. In other embodiments, the lower conductive nodes may have other suitable shapes.

The lower conductive nodes 58 may be referred to as storage nodes, and the upper conductive nodes 60 may be referred to as plate electrodes. In some embodiments, the plate electrodes within ARRAY-1 may all be coupled to one another and the plate electrodes within ARRAY-2 may also all be coupled to one another.

The digit lines D0, D0*, D1 and D1* are shown to comprise conductive materials 64, 66, 68 and 70, respectively. Such conductive materials may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 64, 66, 68 and 70 may be the same composition as one another in some embodiments, or at least one of the conductive materials 64, 66, 68 and 70 may differ from at least one other of the conductive materials 64, 66, 68 and 70 in other embodiments.

The sense-amplifier-circuitries SA-E and SA-O may comprise any suitable configurations. An example sense-amplifier-circuitry SA-E 26 is diagrammatically illustrated in FIG. 9. A dashed line 71 is provided to show an approximate boundary of the sense-amplifier-circuitry. Although the illustrated circuitry is described as being the SA-E sense-amplifier-circuitry 26, it is to be understood that the SA-O sense-amplifier-circuitry 28 (FIG. 4) may comprise an identical configuration as that describe relative to the example configuration of FIG. 9.

The sense-amplifier-circuitry 26 of FIG. 9 includes a p-sense amplifier 80 comprising a pair of cross-coupled pull-up transistors 82 and 84, and includes an n-sense amplifier 86 comprising a pair of cross-coupled pull-down transistors 88 and 90. The p-sense amplifier 80 is coupled with active pull-up circuitry (labeled ACT), and the n-sense amplifier 86 is coupled with a common node (labeled RNL). The illustrated sense-amplifier-circuitry SA-E is coupled with the digit lines D0 and D0*; or in other words the digit lines D0 and D0* are comparatively coupled with one another through the illustrated sense-amplifier-circuitry SA-E. In operation, the amplifiers 80 and 86 may be utilized together to detect the relative signal voltages of D0 and D0*, and to drive the higher signal voltage to VCC while driving the lower signal voltage to ground. Also, inputs and outputs associated with the sense amplifier (labeled as I/O) may be utilized for exporting data regarding the relative signal voltages of D0 and D0*, and/or for programming memory cells along one or both of D0 and D0*.

The illustrated sense-amplifier-circuitry also has equilibration circuitry (labeled EQ) provided therein to balance electrical properties within the sense amplifier. Other circuitry (not shown) may also be provided within the sense-amplifier-circuitry. The sense-amplifier-circuitry of FIG. 9 may comprise any suitable configuration.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a base comprising sense-amplifier-circuitry, a first deck over the base, and a second deck over the first deck. The first deck includes a first portion of a first array of first memory cells, and includes a first portion of a second array of second memory cells. The second deck includes a second portion of the first array of the first memory cells, and includes a second portion of the second array of the second memory cells. A first digit line is associated with the first array, and a second digit line is associated with the second array. The first and second digit lines are comparatively coupled with one another through the sense-amplifier-circuitry.

Some embodiments include an integrated assembly having a base comprising a first sense-amplifier-circuitry and a second sense-amplifier-circuitry, with the second sense-amplifier-circuitry being laterally displaced from the first sense-amplifier-circuitry. A first deck is over the base. The first deck comprises a first portion of a first array of first memory cells, and comprises a first portion of a second array of second memory cells. A second deck is over the first deck. The second deck comprises a second portion of the first array of first memory cells, and comprises a second portion of the second array of second memory cells. First digit lines are associated with the first array. The first digit lines alternate between even first digit lines and odd first digit lines. Second digit lines are associated with the second array. The second digit lines alternate between even second digit lines and odd second digit lines. Individual of the even first digit lines are comparatively coupled with individual of the even second digit lines through the first sense-amplifier-circuitry. Individual of the odd first digit lines are comparatively coupled with individual of the odd second digit lines through the second sense-amplifier-circuitry.

Some embodiments include an integrated assembly comprising a first sense-amplifier-circuitry laterally displaced relative to a second sense-amplifier-circuitry. First digit lines are vertically displaced relative to the first and second sense-amplifier-circuitries and extend along a first memory array. The first digit lines are laterally displaced relative to one another and alternate between even first digit lines and odd first digit lines. Second digit lines are vertically displaced relative to the first and second sense-amplifier-circuitries, and extend along a second memory array. The second digit lines are laterally displaced relative to one another and alternate between even second digit lines and odd second digit lines. Individual of the even first digit lines are comparatively coupled with individual of the even second digit lines through the first sense-amplifier-circuitry. Individual of the odd first digit lines are comparatively coupled with individual of the odd second digit lines through the second sense-amplifier-circuitry. A first set of first wordlines extends along the first memory array. A second set of second wordlines extends along the second memory array. The first wordlines are coupled with first wordline-driver-circuitry. The second wordlines are coupled with second wordline-driver-circuitry. The first sense-amplifier-circuitry, the second sense-amplifier-circuitry, the first wordline-driver-circuitry and the second wordline-driver-circuitry are directly under the first and second memory arrays.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a base comprising a first sense-amplifier-circuitry and a second sense-amplifier-circuitry, with the second sense-amplifier-circuitry being laterally displaced from the first sense-amplifier-circuitry;
   a first deck over the base; the first deck comprising a first portion of a first array of first memory cells, and comprising a first portion of a second array of second memory cells;
   a second deck over the first deck; the second deck comprising a second portion of the first array of first memory cells, and comprising a second portion of the second array of second memory cells;
   first digit lines associated with the first array, the first digit lines alternating between even first digit lines and odd first digit lines;
   second digit lines associated with the second array, the second digit lines alternating between even second digit lines and odd second digit lines;
   individual of the even first digit lines being comparatively coupled with individual of the even second digit lines through the first sense-amplifier-circuitry; and
   individual of the odd first digit lines being comparatively coupled with individual of the odd second digit lines through the second sense-amplifier-circuitry.

2. The integrated assembly of claim 1 wherein the first and second sense-amplifier-circuitries are directly under the first and second arrays.

3. The integrated assembly of claim 1 wherein:
   the first digit lines are utilized to address the first memory cells;
   a first set of first wordlines is also utilized to address the first memory cells;
   each of the first memory cells is uniquely addressed by one of the first digit and one of the first wordlines;
   the second digit lines are utilized to address the second memory cells;
   a second set of second wordlines is also utilized to address the second memory cells; and
   each of the second memory cells is uniquely addressed by one of the second digit lines and one of the second wordlines.

4. The integrated assembly of claim 3 wherein:
   the wordlines of the first set of wordlines are coupled with first wordline-driver-circuitry;
   the wordlines of the second set of wordlines are coupled with second wordline-driver-circuitry; and
   the first and second wordline-driver-circuitries are directly under the first and second arrays.

5. The integrated assembly of claim 4 wherein:
   the first sense-amplifier-circuitry is arranged in two or more spaced-apart first blocks directly under the first and second arrays;
   the second sense-amplifier-circuitry is arranged in two or more spaced-apart second blocks directly under the first and second arrays;
   the first wordline-driver-circuitry is arranged in two or more spaced-apart third blocks directly under the first and second arrays; and
   the second wordline-driver-circuitry is arranged in two or more spaced-apart fourth blocks directly under the first and second memory arrays.

6. The integrated assembly of claim 5 wherein:
   the first and second blocks together comprise first paired-block-arrangements, with each of the first paired-block-arrangements comprising one of the first blocks and one of the second blocks;
   the third and fourth blocks together comprise second paired-block-arrangements, with each of the second paired-block-arrangements comprising one of the third blocks and one of the fourth blocks; and
   the first and second paired-block-arrangements together are a quilted pattern under the memory arrays.

7. The integrated assembly of claim 1 wherein each of the memory cells comprises a storage-element in combination with a transistor.

8. The integrated assembly of claim 1 wherein each of the memory cells comprises a capacitor in combination with a transistor.

* * * * *